United States Patent [19]

Rauf

[11] Patent Number: 5,651,839
[45] Date of Patent: Jul. 29, 1997

[54] PROCESS FOR ENGINEERING COHERENT TWIN AND COINCIDENT SITE LATTICE GRAIN BOUNDARIES IN POLYCRYSTALLINE MATERIALS

[75] Inventor: Ijaz Rauf, Kingston, Canada

[73] Assignee: Queen's University at Kingston, Kingston, Canada

[21] Appl. No.: 548,939

[22] Filed: Oct. 26, 1995

[51] Int. Cl.$^6$ .............................. C22F 1/08; H01L 21/322; H01L 39/24
[52] U.S. Cl. .............................. 148/95; 148/96; 148/239; 148/559; 148/567; 148/679; 437/233; 437/247; 505/742
[58] Field of Search .............................. 437/101, 233, 437/247; 505/320, 742; 148/95, 96, 239, 559, 567, 679, 687

[56] References Cited

U.S. PATENT DOCUMENTS

| | | | |
|---|---|---|---|
| 3,152,933 | 10/1964 | Reuschel | 148/175 |
| 4,396,640 | 8/1983 | Rocheleau et al. | 427/8 |
| 4,580,524 | 4/1986 | Lackey et al. | 118/725 |
| 4,908,226 | 3/1990 | Kubena et al. | 427/38 |
| 5,064,779 | 11/1991 | Hasegawa | 437/233 |
| 5,239,614 | 8/1993 | Ueno et al. | 392/416 |
| 5,294,778 | 3/1994 | Carman et al. | 219/385 |
| 5,356,756 | 10/1994 | Cavicchi et al. | 430/315 |
| 5,369,087 | 11/1994 | Critchlow et al. | 505/742 |
| 5,409,867 | 4/1995 | Asano | 437/233 |

OTHER PUBLICATIONS

Journal of Materials Science Letters 12 (1993) 1902–1905, "A Novel Method for Preparing Thin Films with Selective Doping in a Single Evaporation Step".

*Primary Examiner*—George Wyszomierski
*Attorney, Agent, or Firm*—Richard J. Hicks

[57] ABSTRACT

A process for producing coherent twin, incoherent twin, low angle tilt, high angle tilt or CSL grain boundaries in materials is described. A planar material or a planar substrate coated with the polycrystalline material is heated in selected areas so as to provide a temperature gradient in the substrate. The temperature gradient is sufficiently large and maintained for a sufficient time so that preferential nucleation occurs and recrystallization in the plane of the polycrystalline material takes place such that coherent twin, incoherent twin, low angle tilt, high angle tilt or CSL boundaries between chains of grains growing along lines of equal temperature are produced.

11 Claims, 6 Drawing Sheets

● CRYSTAL DEFECTS OR IMPURITY ATOMS
○ ATOMS OF MATERIAL BEING DEPOSITED

● CRYSTAL DEFECTS OR IMPURITY ATOMS
○ ATOMS OF MATERIAL BEING DEPOSITED

● CRYSTAL DEFECTS OR IMPURITY ATOMS
○ ATOMS OF MATERIAL BEING DEPOSITED

PROCESS FOR ENGINEERING COHERENT TWIN AND COINCIDENT SITE LATTICE GRAIN BOUNDARIES IN POLYCRYSTALLINE MATERIALS

FIELD OF INVENTION

This invention relates to grain boundary engineering and more particularly to the production of coherent twin and coincident site lattice (CSL) grain boundaries in metallic, intermetallic, superconducting, semiconducting, dielectric and ceramic polycrystalline materials.

BACKGROUND OF INVENTION

The relatively recently developed science of grain boundary engineering is based upon the well-documented fact that different structures can exist for different grain boundaries in metals. It has been shown that the structural differences can lead to different grain boundary properties, such as their energy.

The concept of a coincident site lattice (CSL), whereby at certain crystallographic misorientations, a three-dimensional lattice can be constructed with lattice points common to both adjacent crystals, is also extremely important. The CSL is considered to the smallest common sub-lattice of the adjoining grains. The volume ratio of the unit cell of the CSL to that of the crystal is described by the parameter $\Sigma$, which can also be considered the reciprocal density of coincidental sites. All grain boundaries can be represented by an appropriate CSL description if $\Sigma$ is allowed to approach infinite values.

Grain boundary engineering finds application in four main areas: (a) ordered intermetallic compounds where it can be used to control composition and state of order at grain boundaries and control the distribution of misorientation of neighbouring grains. (b) Electrical properties of materials as studies have shown that electrical resistivity of grain boundaries varies with misorientation of adjacent crystals and is at a minimum for CSL or twin boundaries. (c) Nanocrystalline materials and the production of triple junctions therein and (d) materials for nuclear waste storage by inhibition of crevice corrosion and hydrogen induced cracking in titanium alloys and uniform corrosion in copper alloys.

In mechanical, superconducting and semiconducting applications the use of polycrystalline materials is attractive as they are relatively inexpensive and are easy to produce. However, limitations arise due to the properties of different types of grain boundaries and the anisotropic nature of the individual grains. For example, cracks can propagate easily along certain grain boundaries and cleave grains oriented in certain directions. In orthorhombic $YBa_2Cu_3O$ (YBCO) high temperature superconductors, the current density is higher by a factor of five to ten in the basal plane than in the c-direction. It has also been shown that the critical current density at the boundary decreases with increasing misorientation angles in such materials. In polysilicon, lower electron mobilities have been a problem. A large number of investigations on single grain boundaries in bi-crystals and in polysilicon have demonstrated their electrical activity as recombination centers. Small angle grain boundaries ($\theta<10°$) show an efficient current degradation (20–30%), while random large angle grain boundaries are usually strong recombination centers. Coherent twins or other low energy near-coincidence site lattice (CSL) boundaries are not at all or very weakly active.

Other than mobility problems with semiconducting materials, as device dimensions approach deep sub-micron sizes, the reliability of the interconnect in terms of electromigration and also the interconnect resistance becomes increasingly important. Therefore, lower resistance metals and the ways to reduce their resistance further in thin film form are being investigated. Copper thin films are attractive as ultra large scale integration (ULSI) conductor materials as they have a lower resistivity and higher melting point as compared to the presently employed aluminum films. Reducing the resistivity further by employing textured films to enhance mobility would allow interconnect dimensions to shrink without compromising electromigration resistance.

For mechanical materials, texture is usually controlled by deformation and post-deformation controlled recrystallization. For bulk superconductors, melt-textured growth has been applied to control the texture. Textured thin films are usually obtained by a combination of deposition method and choice of substrate material.

A zone confining process for the production of tin-doped indium oxide (ITO), thin films having chains of grains oriented in the same direction has been described by the present inventor in Journal of Materials Science Letters 12:1902 (1993), the disclosure of which is incorporated herein by reference. There remains a need to extend the work on ITO to other alloys and metals and to improve, by grain boundary engineering techniques, the physical and electrical properties of vapour deposited and other films and to bulk planar polycrystalline materials up to about 1 cm thick.

OBJECT OF INVENTION

An object of the present invention is to provide a process for producing polycrystalline materials having interconnected grains oriented in a selected direction and separated by selected grain boundaries forming chains along the lines of equal temperature. Preferably, the selected direction is the <110> direction and the metal is copper. For high $T_c$ superconductors the selected direction in <100> and the material is YBCO.

Another object of this invention is to provide polycrystalline films having interconnected grains oriented in a selected direction separated by grain boundaries of selected type. Preferably, the material is copper, a semiconductor such as ITO or a high $T_c$ superconductor material such as YBCO.

BRIEF STATEMENT OF INVENTION

By one aspect of this invention there is provided a process for producing chains of grains oriented in the same direction, separated by boundaries selected from coherent twin, incoherent twin, CSL, low angle tilt boundaries, in a polycrystalline material having at least one planar surface comprising heating selected areas of said planar material so as to provide at least one temperature gradient across said planar surface and a zone of uniform temperature through said planar material in a direction perpendicular said planar surface, for a sufficient time so as to cause preferential nucleation of grains of said material in said zone of uniform temperature and induce recrystallization in said zone of uniform temperature and thereby produce a selected one of said boundaries between grains growing along lines of equal temperature.

By another aspect of this invention there is provided a planar poly-crystalline material having interconnected chains of grains oriented in a selected direction and separated by a selected one of coherent twin, incoherent twin grain boundaries, CSL boundaries, low angle tilt and high angle tilt grain boundaries.

DETAILED DESCRIPTION OF PREFERRED EMBODIMENTS

Figure 1:
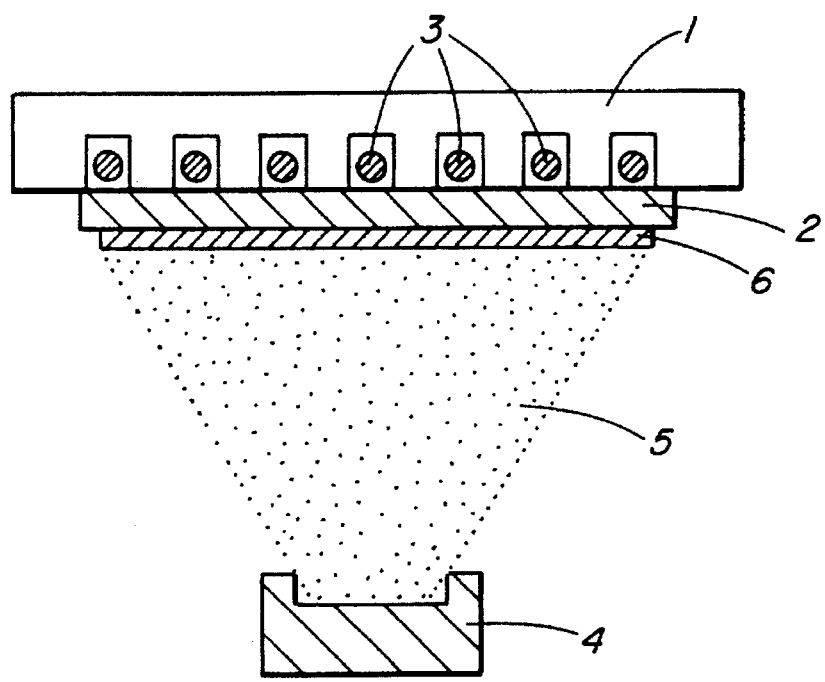
FIG. 1 is a schematic sketch of one embodiment of an apparatus for carrying out the process of the invention.

In FIG. 1 there is shown an apparatus for carrying out one embodiment of the process of the present invention. The apparatus is contained within a vacuum chamber (not shown) or controlled atmosphere and comprises a substrate holder 1 into which a silica substrate 2 can be removably inserted, and an array of electrical resistance heaters 3. The heaters are wired in series and connected to an electrical power source (not shown). The heaters 3 are arranged in the holder 1 so as to be in physical contact with silica substrate 2 held in holder 1. When the heaters 3 are operating, they set up a series of temperature gradients across the silica substrate, with temperature peaks corresponding to the positions of the heaters, and troughs at positions corresponding to the midpoint of the gaps between consecutive heaters. The material, such as $In_2O_3$ and $SnO_2$ or copper or super conducting material, to be vapour deposited on the silica substrate 2 is contained in a crucible 4 in overlying but spaced relation from substrate 2. The material to be deposited is heated by an electron beam or other heater (not shown) and vaporized to create a cloud of vapour 5. The vapour deposits in a film 6 on the silica sheet 2, the composition of which varies in accordance with the temperature gradients across the substrate 2. In a typical, but not limiting example, the silica substrate 2 is heated by an array of heating elements 1 mm in diameter about 0.6 cm apart on the surface of the substrate, to a temperature of 350° C. adjacent to the heating elements and 345° C. at the midpoint between the elements. Preferably, the temperature gradient is at least 50° C. $m^{-1}$ and most preferably 5000° C. $m^{-1}$. The temperature difference across the temperature gradient is preferably at least 1° C. and should not be higher than the melting point of the deposited material.

While films deposited on a substrate have so far been emphasized, it will be apparent to those skilled in the art that the thermal gradient technique is equally applicable to bulk materials such as planar polycrystalline materials fabricated by conventional techniques such as rolling or casting, up to about 1 cm thick. At thicknesses greater than about 1 cm, conductivity considerations preclude uniform temperature in any selected zone, through the thickness of the sample, i.e. a temperature gradient may exist in a selected zone as well as between adjacent zones. It will also be appreciated that the amount of cold work in the polycrystalline material prior to subjecting to the temperature gradient process of the present invention is immaterial.

Although certain of the following examples concern heating with a heat lamp including a quartz bulb and heating with a heater element, other heat sources would be known to a person skilled in the art, such as, for example, a laser, a heated roller or a heated wire.

In another embodiment, a preheated substrate may be dipped into a chemical solution of the material desired for the coating so as to obtain a film coating, or a chemical solution may be sprayed onto the substrate which is then subjected to periodic or nonperiodic arrays of temperature gradients.

EXAMPLE 1

$In_2O_3/SnO_2$ pellets were vaporized in crucible 4 (FIG. 1) and the vapour was crystallized on the silica substrate for 1 hour. The temperature gradient was held for the vaporization period. The product comprised stripes of free electron rich, tin-rich $In_2O_3$~0.50 nm wide interspersed between adjoining stripes of $In_2O_3$~200 nm wide. This product had a considerably lower resistivity ($4.4 \times 10^{-7}$ ohm m) than a similar product having a uniform $In_2O_3/SnO$ layer ($2 \times 10^{-16}$ ohm m). Chains of grains oriented in the same direction, separated by twin or other CSL boundaries were observed.

EXAMPLE 2

Figure 2:
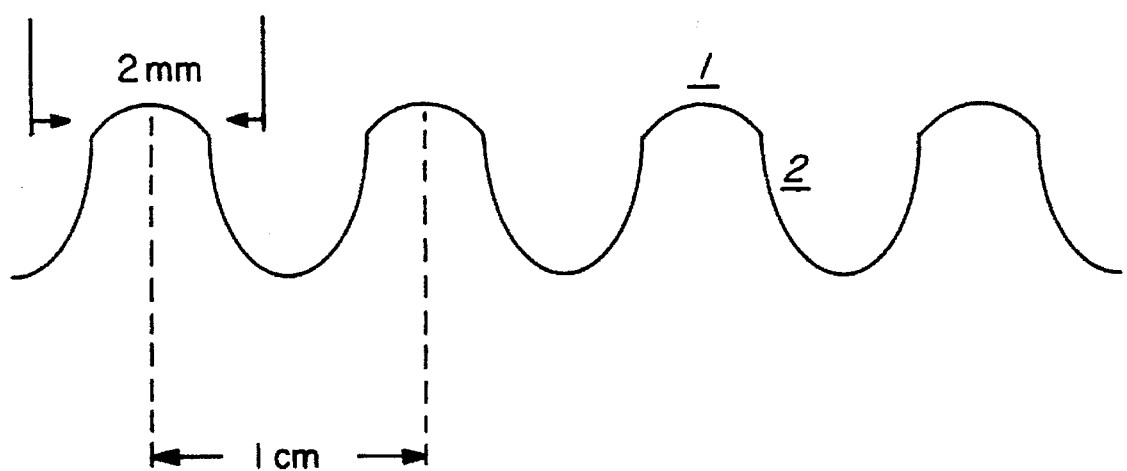
FIG. 2 is a schematic representation of a line profile across the substrate surface showing variation in temperature. TEM samples were prepared from positions 1 and 2.

The above experiment was repeated using copper hexafluroacetylacetone trimethylvinylsilane, known commercially as Cupra Select as the source material. A heater element was designed to produce a zone-confining effect according to the specifications given above with the exception that the diameter of the heater rod in the present case was 2 mm and the heat insulating heater base was replaced with simple chamber atmosphere. The substrate holder was a 1.5 mm stainless steel plate which was placed about 2 mm above the heater rod. FIG. 2 shows a schematic representation of a temperature profile along a line on the substrate surface.

The films were deposited by a low pressure Chemical Vapour Deposition (CVD) in a single wafer rotating disc reactor. The substrates were p-type, 100 μm <100> silicon wafers with a 1.2 μm blanket covering of $SiO_2$. Copper depositions were carried out for 30 minutes for a deposition rate of 40 nm/min. using a process gas flow of 4 sccm of nitrogen and an average dilution gas flow of 8 sccm of hydrogen. The chamber pressure was maintained at 10 Torr and the substrate temperature was 275° C. with a rotation speed of 50 rpm.

Figure 3:
FIG. 3 is an axial dark field image from position 1.

Transmission electron microscopy analysis was carried out on two specimens from the regions representing positions at 1 and 2 as marked in FIG. 2. A plan-view aperture grid method was used to remove the Cu film from the substrate and to produce thin samples for TEM observations. Bright field and axial dark field images were recorded. The smallest condenser aperture in conjunction with the smallest spot size produced a spot of diameter ~1.5 nm for recording microdiffraction patterns from individual grains and grain boundaries. FIG. 3 shows a dark field image from the sample prepared from position 1 where interconnected grains oriented in the same direction can be seen to form a chain along the line of equal temperature.

Figure 4A:
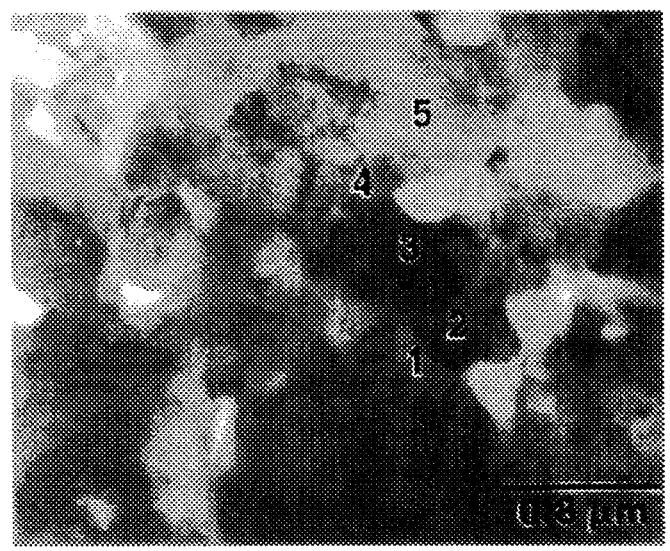
FIG. 4a is a bright field image from position 1.
Figure 4B:
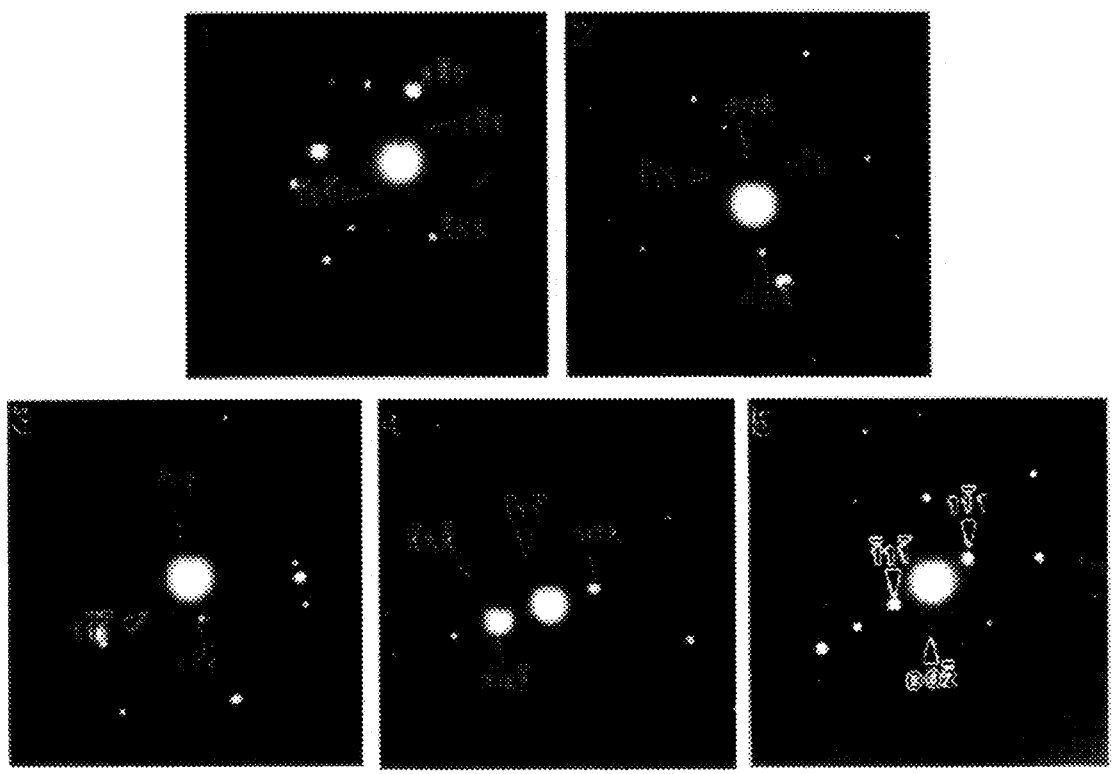
FIG. 4b are microdiffraction patterns from grains 1-5.
Figure 5A:
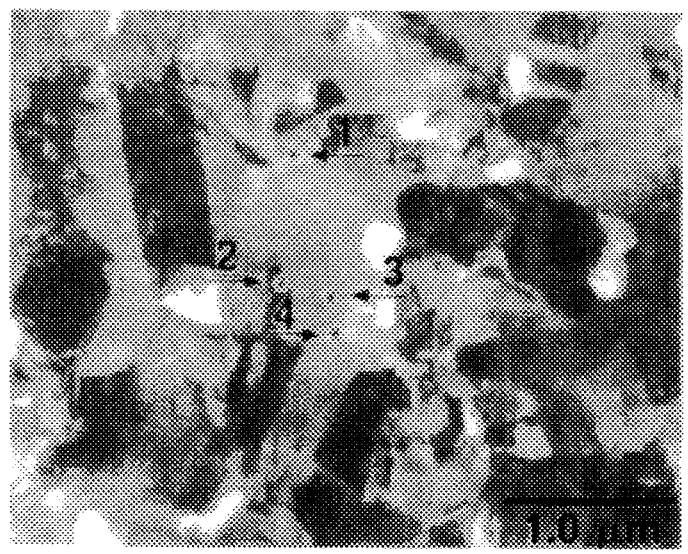
FIG. 5a is a bright field image from position 2.
Figure 5B:
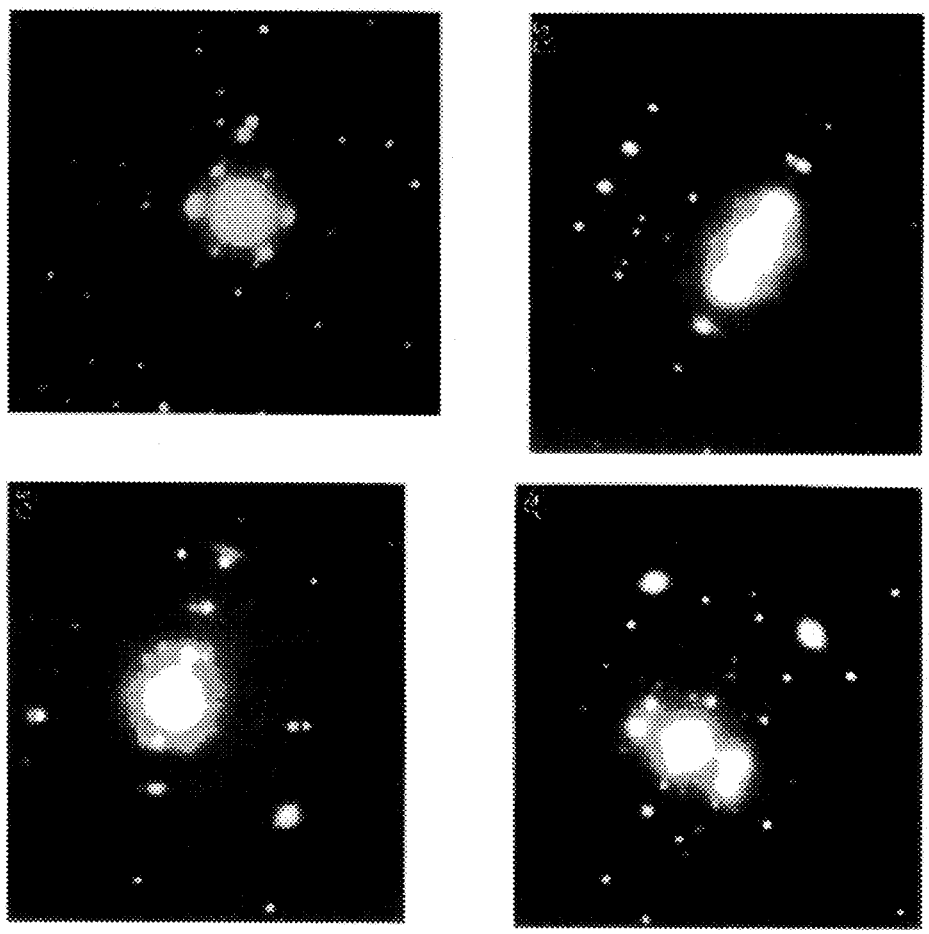
FIG. 5b are microdiffraction patterns from individual grain boundaries 1-4 as marked in (FIG. 5a)

FIG. 4 shows a bright field image and five microdiffraction patterns recorded from grains 1-5 as marked in the bright field image. All of the grains are closely oriented to the <110> pole as can be seen from the diffraction pattern (specifically grain 3 is exactly on <110> pole). Angles measured between the microdiffraction patterns from grain 1 and 2 suggest that the boundary between these two grains is a low angle (θ~8°) tilt boundary. Similarly, the angle between grain 2 and 3 is 53°. In the case of fcc and bcc crystals a rotation of 53° about [100] will cause one-fifth of the lattice points to coincide thus providing a low energy grain boundary. The boundary between 3 and 4 is a coherent (210) twin while that between 4 and 5 is a tilt boundary with a tilt angle of 13°. FIG. 5(a) shows the bright field image from the TEM sample prepared from position 2. FIG. (5b) shows a series of electron microdiffraction patterns from the individual grain boundaries as marked by numerals in FIG. 5(a). All of the boundaries are coherent (110) twins.

At position 1, although there was a small point to point difference in temperature providing a gradient, the gradient amplitude was very small and was spread over a large area. However, at position 2 the gradient was large and was effective over a very small region making the gradient very sharp. At both these positions, all the grains within each chain were oriented with the <110> direction perpendicular to the substrate indicating a <110> texture along the chains. Grain boundaries observed in the chain at position 1 were a mixture of low angle tilt, low energy CSL and a twin boundary, while those observed in the chain at position 2 were all coherent twin boundaries. All the grains along the line of equal temperature had a common <110> direction. The alignment of grains into chains of the same orientation is seen at position 1, where the gradient is small as well as at position 2 where the gradient is large. However, the twinning is observed only at position 2, where the gradient is large. This can be explained by considering the thin film growth mechanisms taking place within the film.

Figure 6A:
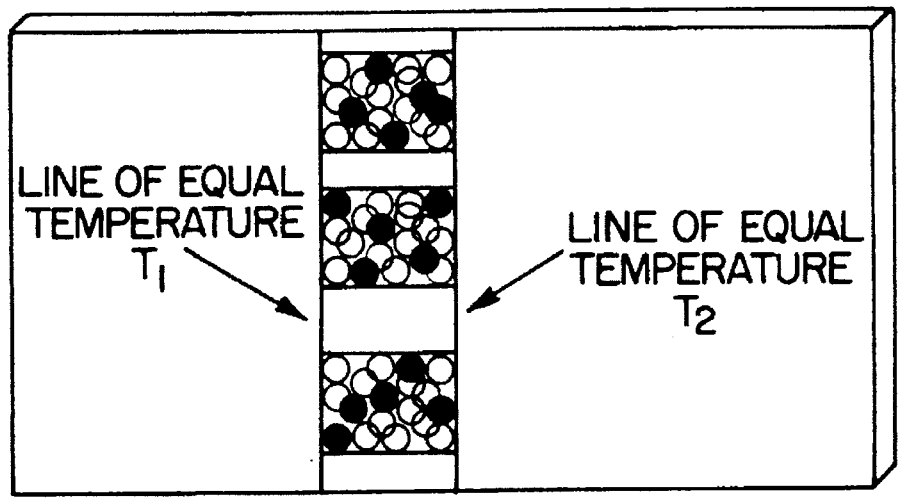
FIG. 6a is a schematic diagram illustrating nucleation mechanism after adsorption.
Figure 6B:
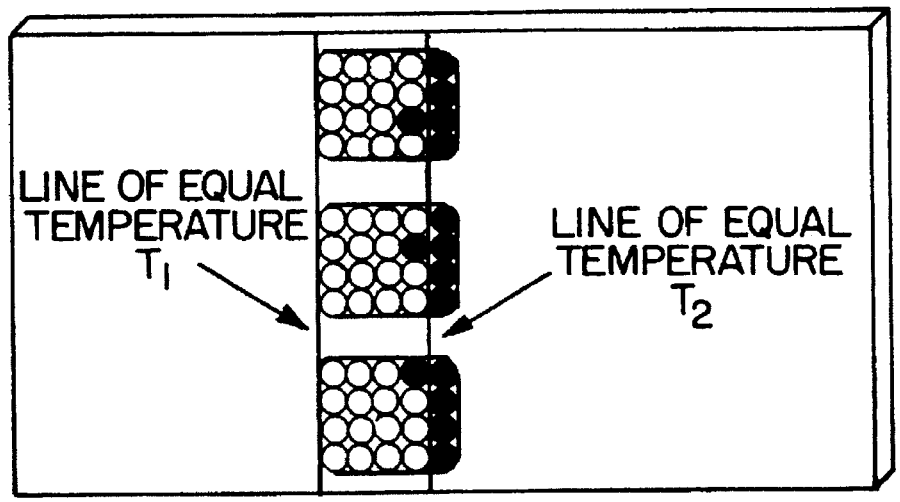
FIG. 6b is a schematic diagram illustrating nucleation mechanism after condensation.
Figure 7:
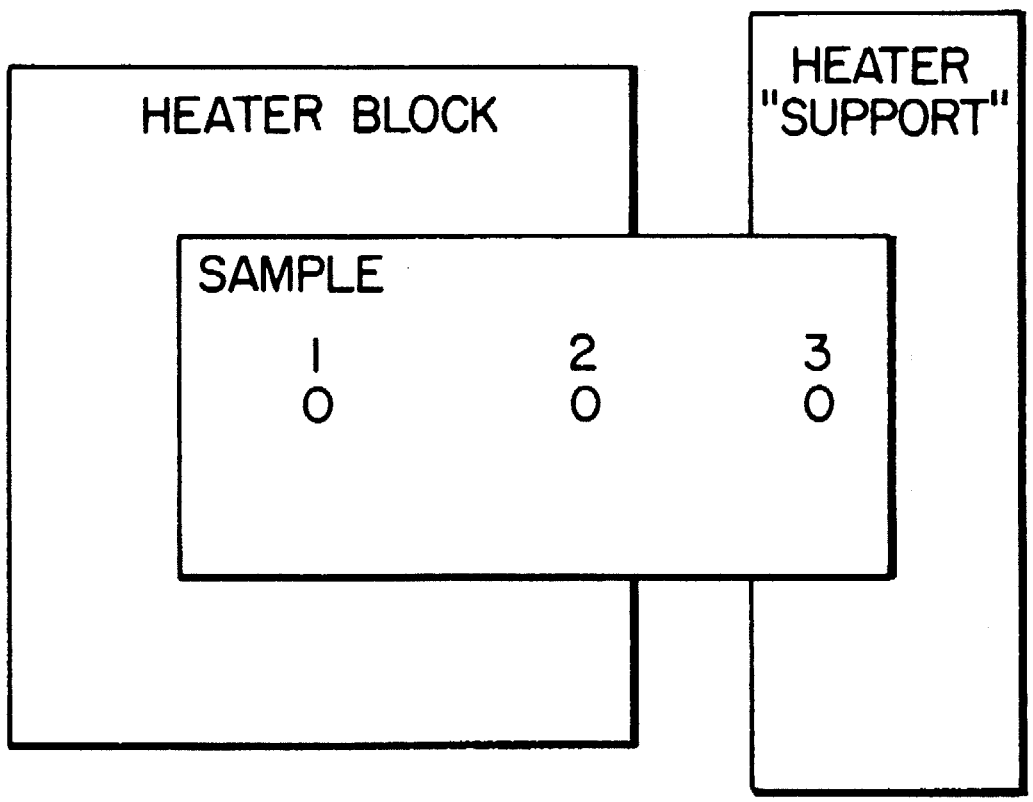
FIG. 7 is a schematic sketch of an alternative, magnetron sputtering apparatus for carrying out the process.

The growth mechanism can be divided into two major steps, the nucleation and the growth. The nucleation stage can be further divided into two sub-stages, (i) impingement of vapor and adsorption atoms (adatoms) by wetting the surface (ii) condensation of adatoms to form crystalline nuclei which subsequently grow into a matrix which includes various forms of defects. The first sub-stage of nucleation is statistically random. However, as soon as the incoming vapor molecules touch the substrate they feel the temperature gradient. This is demonstrated by considering two lines of equal temperature, with temperatures $T_1$ and $T_2$ such that $T_1 < T_2$ on the substrate surface, between which a nucleus is forming as shown in FIG. 6a. Thus the part of nuclei forming at temperature $T_1$ is in a colder region as compared to the part condensing at temperature $T_2$. The solid solubility of crystalline defects is higher in the part condensing at temperature $T_2$ as compared to the part forming at $T_1$. Hence during the condensation and crystallization sub-stage of nucleation, the defects (which include impurities, vacancies, interstitial etc.) are dragged from the region where nucleation occurs towards the boundary of the subsequent grain forming at a higher temperature ($T_2$) (FIG. 6b). All the nuclei growing between same two lines of equal temperature, $T_1$ and $T_2$ crystallize under a similar directional driving force, related to the local temperature and the temperature gradient, hence they orient with a similar crystalline direction perpendicular to the substrate. Nuclei crystallizing at a neighboring set of lines of equal temperature are textured with slight misorientation to the previous set. The misorientation of the second chain of crystallites with respect to the first chain depends on the difference between the magnitude of the local temperature. Thus in some cases, depending on the overall variation in the temperature as the function of position, the films may not have a preferred orientation at a macroscopic level (as we observed in our x-ray diffraction experiments on above films) but there is a localized texture. Thus texture is generated by a directional driving force and hence requires a mere presence of a temperature gradient. However, the relative misorientation of grains with respect to each other within a chain will depend on the magnitude of the local temperature gradient at that location. Because of the relative energies required to create a structure, low values of temperature gradient will result in preferential orientation, a medium temperature gradient in twinning, and high values may generate single crystal strips. Hence, twinning will only be generated when the temperature gradient is relatively large (as we see at position 2) while the local texture may result from a mere presence of the temperature gradient (as we see it at position 1 as well as position 2).

Alternatively the primary nucleation and growth process is followed by recrystallization in the xy-plane of the film when a complete re-organization of the atoms may occur. This generates texture and coherent twin boundaries between the grains growing along the same line of equal temperature. In that case, the recrystallization process responsible for texture generation and twinning will depend on the magnitude of the local temperature gradient at a given position. Thus the orientation of the crystallite in the same direction may be achieved with a small gradient, however, the generation of twin grain boundaries may require a large temperature gradient.

In summary, a simple and inexpensive method is presented to regulate texture and engineer grain boundaries at desired positions in the material using a spatially periodic temperature gradient. With this process it is possible to produce chains of grains preferentially oriented in the same direction by using an extremely small temperature gradient. However, production of twin grain boundaries or single crystal strips requires a progressively larger magnitude of gradient. Hence with the combination of growth rate and temperature gradient, one can control the local texture and engineer desired grain boundaries along a chain of grains. Zone confining may provide inexpensive, high quality polycrystalline thin film materials for semiconducting or superconducting applications with electromigration properties which may rival those of single crystals.

EXAMPLE 3

High temperature superconductors (YBCO) samples were deposited by magnetron sputtering on a $LaAlO_3$ substrate. The experimental arrangement is shown schematically in FIG. 6. Three temperature zones were defined and temperatures from the three positions marked with numerals 1, 2 and 3 were measured at different times throughout the deposition as shown in table 1 below. A temperature gradient of about 50° was maintained between position 2 and 3 over a linear distance of about 5 mm. Sample from position 1 was used as a reference for the zone-confining effect. No preferred orientation was detected in the sample from position 1 whereas chains of grains oriented with their c-axis (001) perpendicular to the substrate were observed in the sample prepared from position 2 in the TEM micrographs.

TABLE 1

| Time | Elapse time | Sputter pressure (PA) | U plasma (V) | U heater (V) | I heater (A) | Temp. ref. (°C.) | Meas. point. 1 (°C.) | Meas. point. 2 (°C.) | Meas. point. 3 (°C.) | Remarks |
| --- | --- | --- | --- | --- | --- | --- | --- | --- | --- | --- |
| | | | Presp. 131 | | | | | | | Offset: 5,05 Pa Emissivity setting on pyrometer 0,68 (si) |
| 9.41 | 0.00 | 14,6 | 131 | 4,03 | 28,6 | 731 | 682 | 664 | 619 | Dep. started |
| 10.00 | 0.19 | 14,7 | 125 | | | 731 | 671 | 652 | 606 | |
| 11.28 | 1.47 | 15,1 | 124 | 4.03 | | 727 | 667 | 646 | 598 | |
| 12.28 | 2.47 | 14,7 | 123 | | | 724 | 648 | 628 | 590 | |
| 13.41 | 4.00 | 14,7 | 123 | | | 722 | 657 | 640 | 602 | Dep. stopped "Normal" cooldown: 3,7 V,O₂ to 400 Torr, 0,5 mm/min, at 200° C. shutdown |

It will be appreciated by those skilled in the art that, while this specification refers specifically to vapour deposited metallic films, and particularly copper films, other polycrystalline materials can be equally well be treated, regardless of their method of formation. While the process is not believed applicable to polymeric materials, it can be applied to metallic, ceramic, semi conductors and high temperature superconducting materials in film or sheet form, alone or deposited on a substrate, and wherein the film or sheet is up to about 1 cm thick. The process may be enhanced and the desired properties may be achieved in a shorter time if the gradient or the surface of the substrate is slowly moved to and fro, by either moving the heat source or the substrate or both relative to each other.

EXAMPLE 4

A pre-deposited sample of commercial ITO film was processed to produce a zone-confirming effect. An ITO film on a soda-lime glass substrate containing a $SiO_2$ diffusion barrier was treated under a heat lamp. The lamp system had a 2000 watt line heater, comprising a quartz bulb charged with argon gas and having a tungsten filament. The heater was filled with an elliptical reflector. The bulb was located in one reflection focus and the reflected energy was focused down to the other focus. The sample was placed near the 2nd focal point of the reflector. A 1 mm slit was used to block the unwanted energy. The sample was slowly moved at a speed of ~25 μm/sec. using a stepper motor. A total width of 4.5 mm was covered in 30 minutes during 1 sweep. The sample was brought back to the starting position immediately after 1 sweep and a second sweep of the same type was carried out. The total processing time was 1 hour in an oxygen free $N_2$ atmosphere to avoid any change in the oxidation state of the sample. The sheet resistance before treatment was 8.66 Ω/□ as measured by four point linear probe (Van de Paw). After treatment it was measured by the same method and found to be 5.06 Ω/□ (Ohms per square).

In yet another embodiment of the invention, there is provided an alternative apparatus for carrying out the zone-confining as described in Example 4. The apparatus comprises a heat source (either a heat lamp, an infrared laser, a conductive heater or a radiant heater), a slit system, to define the energy beams from the source, a focusing system to focus the heat energy from the heat source onto the substrate (onto which a coating with zone-confinement may be deposited) or the coating itself (if a zone-confinement is desired in a differently deposited coating). A computer controlled mobile system to move either the energy source or the substrate and a source of material for the coatings to be deposited under zone-confinement is also provided.

I claim:

1. A process for producing, in a planar film of polycrystalline material containing a dopant, chains of grains oriented in the same direction which are separated by boundaries within said chains selected from the group consisting of coherent twin, incoherent twin, coincident site lattice, low angle tilt and high angle tilt boundaries, and in which adjacent said chains in said planar film are separated by dopant-rich random boundaries, said process comprising heating selected areas of said planar film so as to provide at least one temperature gradient of at least 50° $Cm^{-1}$ across said planar film and a zone of uniform temperature, which is below the melting temperature of said polycrystalline material, through said planar film in a direction perpendicular to a planar surface thereof, for a sufficient time so as to cause preferential nucleation of grains of said material in said zone of uniform temperature and induce recrystallization in said zone of uniform temperature and thereby produce a selected one of said boundaries within said chains between grains growing along lines of equal temperature.

2. The process as claimed in claim 1 wherein said polycrystalline material is selected from the group consisting of metal, metal alloys, semi conductors and superconducting materials.

3. The process as claimed in claim 2 wherein said polycrystalline material comprises copper.

4. The process as claimed in claim 3 wherein said gains are oriented in a <110> plane.

5. The process as claimed in claim 1 wherein said temperature gradient is at least 5000° $Cm^{-1}$.

6. The process as claimed in claim 1 wherein the temperature difference across said temperature gradient is at least 1° C.

7. The process as claimed in claim 1 wherein said process is carried out in a vacuum.

8. The process as claimed in claim 7 wherein said vacuum is at most 10 torr.

9. The process as claimed in claim 8 further comprising depositing said planar film on a single wafer rotating disc prior to said heating.

10. The process as claimed in claim 9 wherein said disc is selected from the group consisting of a p-type, 100 mm <100> Silicon wafer, a silica wafer and a quartz slide.

11. The process as claimed in claim 10 wherein said disc is rotated at about 50 rpm.

* * * * *